METHOD OF MAKING A POTENTIOMETER ON A THIN FILM CIRCUITRY PANEL

Filed Aug. 26, 1964

INVENTOR.
Ronald F. Cruthers,
BY
W. H. Losche
Paul S. Collignon Att'ys.

3,319,320
METHOD OF MAKING A POTENTIOMETER ON A THIN FILM CIRCUITRY PANEL

Ronald F. Cruthers, Indianapolis, Ind., assignor to the United States of America as represented by the Secretary of the Navy Filed Aug. 26, 1964, Ser. No. 392,357
1 Claim. (Cl. 29—155.7)

ABSTRACT OF THE DISCLOSURE

A method of making a potentiometer comprising depositing an arcuated resistance element concentrically about a hole in a substrate, then depositing a circular conductive pad on said substrate and a plurality of terminal conductive pads that contact one each with the ends of said arcuated resistance element and one terminal conductive pad being in contact with said circular conductive pad, then attaching a wiper arm to said substrate, with said wiper arm contacting both said arcuated resistance element and said circular conductive pad.

The invention described herein may be manufactured and used by or for the Government of the United States of America for governmental purposes without the payment of any royalties therein or therefor.

The present invention relates to potentiometers and more particularly to potentiometers that are made integral with thin film circuitry panels.

There is a constant demand for smaller electrical and electronic components, particularly in the aircraft and missile fields, as weight is of extreme importance. One concept of microelectronics which offers a great reduction in size and weight of electronic units is that of integrated circuitry which is formed on insulated bases. Integrated circuitry includes a number of active and passive components which are fabricated by one or more of a combination of several thin-film deposition techniques onto a substrate.

The substrate can be of any suitable material, such as glass, alumina, beryllia, or barium titanate. The present state of the art of thin-film microcircuitry fabrication permits the deposition of resistors, capacitors, small inductances, and connectors. This solid film can be deposited onto substrates by various methods such as electrodeposition, chemical precipitation, thermal decomposition, cathodic sputtering, and high vacuum evaporation. The depositing of films by high vacuum evaporation has been particularly successful as the process is easily controlled, and the deposited films have a high degree of purity.

The present invention provides a method for producing a potentiometer on a thin-film circuit panel. A small diameter hole is made in the substrate for each potentiometer to be produced and the top surface is then given a protective coating, such as a thin layer of silicon monoxide. Next a resistor of an arcuated pattern is deposited on top of the protective coating and then the conductor patterns are deposited. A circular conductive pattern is deposited concentrically with the hole, and terminal portions are deposited onto each end of the actuated resistor. The final step consists of attaching a mechanical wiper to the substrate by utilizing the hole therein.

It is therefore a general object of the present invention to provide a variable resistance device on an integrated circuitry panel.

Other objects and advantages of the present invention will be readily appreciated as the same becomes better understood by reference to the following detailed description when considered in connection with the accompanying drawing wherein.

Figure 1:
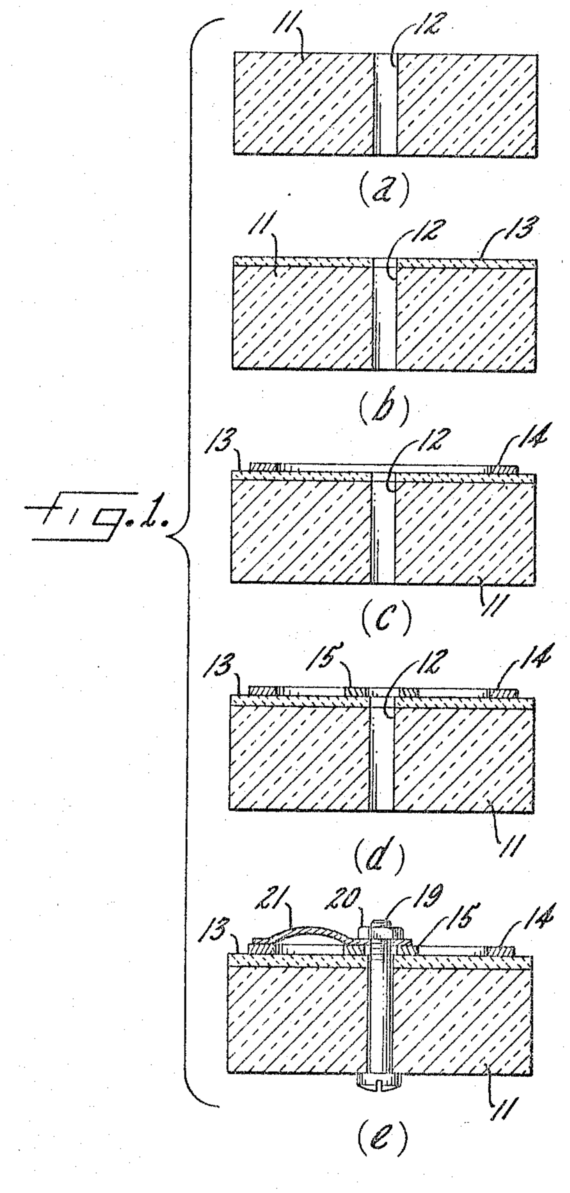
FIGURE 1 is a diagrammatic view illustrating a step by step method for producing a variable resistance on an integrated circuitry panel.

Referring now to the drawing, wherein like reference characters designate like or corresponding parts throughout the several views, there is shown a substrate 11 having a small diameter hole 12 therein. The substrate is coated on one side with a protective coating 13, such as silicon monoxide. The silicon monoxide serves as a barrier to prevent any alkaline ions in the substrate material from adversely affecting any thin-film materials that are deposited. Other protective coatings that might be used are neodymium oxide, titanium oxide, tantalum, and barium titanate.

Figure 2:
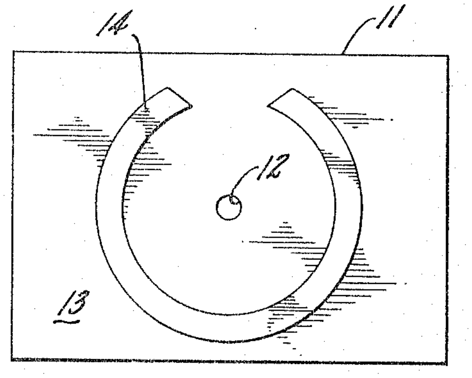
FIGURE 2 is an enlarged top plan view showing a resistance element deposited onto a substrate.

The next step in the manufacture of the potentiometer is that of depositing an arcuate pattern of a resistance material. The resistance material, by way of example, might be chromium, nickel-chromium, tin oxide, rhenium, chromium-silicon monoxide, or aluminum oxide. Referring specifically to FIGURE 2 of the drawing, resistance element 14 is shown concentrically deposited about hole 12 and extends for an arcuate distance of approximately 300 degrees.

Figure 3:
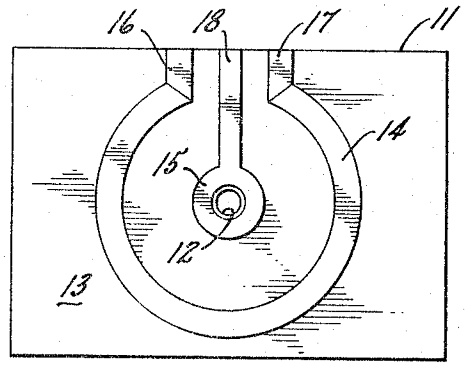
FIGURE 3 is an enlarged top plan view showing a resistance element and conductor elements deposited onto a substrate.
Figure 4:
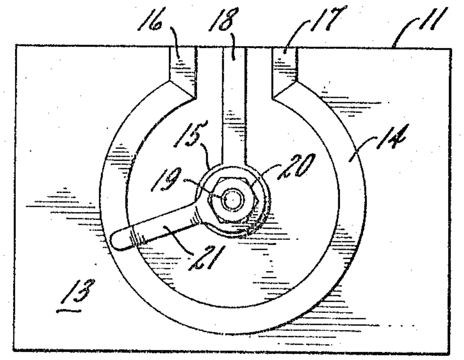
FIGURE 4 is an enlarged top plan view showing a complete potentiometer that is integral with an integrated circuitry panel.

After the resistance element is deposited onto substrate 11, the next step consists in depositing the necessary conductors onto the substrate. By way of example, the conductor material might be chromium-copper, chromium-gold, beryllium-copper, copper, aluminum, platinum-gold, or aluminum-bronze. As best shown in FIGURE 3 of the drawing, a circular pad 15 is deposited adjacent to and concentric with hole 12. Terminal pads 16, 17, and 18 are simultaneously deposited onto the substrate at the same time that pad 15 is deposited, with terminal pads 16 and 17 being in contact with the ends of the resistance pattern 14 and terminal pad 18 being in contact with circular pad 15.

Referring now to FIGURES 1(*e*) and 4, there is shown a wiper arm 21 that is secured to substrate 11 by means of screw 19 that passes through hole 12. Screw 19 is secured by means of nut 20. When an electrical connection is made between the terminal pads 17 and 18, the path of current flow will be through terminal pad 17, a portion of resistance element 14, wiper arm 21, circular pad 15, and terminal pad 18. Likewise, when an electrical connection is made between terminals 16 and 18, the path of current flow will be through terminal 16, a portion of resistance element 14, wiper arm 21, circular pad 15, and terminal pad 18. By rotation of wiper arm 21, any portion of resistance element 14 can be placed in circuit.

It can thus be seen that the present invention provides a very small potentiometer that is incorporated integral with a substrate. When other resistor elements are to be incorporated in the circuitry, it is possible that all resistance elements can be deposited in the same operation.

Obviously many modifications and variations of the present invention are possible in the light of the above teachings. It is therefore to be understood, that within the scope of the appended claim, the invention may be practiced otherwise than as specifically described.

What is claimed is:

A method of making a potentiometer integral with the substrate of a thin-film circuitry panel comprising:

first providing a hole in said substrate, then depositing a protective coating on said substrate, said protective coating being selected from the group consisting of silicon monoxide, neodymium oxide, titanium oxide, tantalum, and barium titanate, then depositing on said coating concentrically about said hole an arcuated resistance element, then depositing a plurality of conductive terminal pads and a circular conductive pad on said coating, said pads being selected from the group consisting of chromium-copper, chromium-gold, beryllium-copper, copper, aluminum, platinum-gold, and aluminum-bronze, said circular conductive pad being positioned between said hole and said arcuated resistance element and said conductive terminal pads being in contact one each with the ends of said arcuated resistance element and one conductive terminal pad being in contact with said circular conductive pad, and then attaching a wiper arm to said substrate by fastening means secured through said hole in said substrate, said wiper arm being in contact with both said arcuated resistance element and said circular conductive pad.

References Cited by the Examiner

UNITED STATES PATENTS

| | | | |
|---|---|---|---|
| Re. 25,479 | 11/1963 | Coler | 338—162 |
| 2,756,307 | 7/1956 | Schwartz. | |
| 2,927,048 | 3/1960 | Pritkin | 117—217 X |
| 3,138,744 | 6/1964 | Kilby | 317—101 |
| 3,165,714 | 1/1965 | Dreyfus | 338—162 |
| 3,199,002 | 8/1965 | Martin | 29—155.5 X |
| 3,206,702 | 9/1965 | Greenwood | 338—162 |
| 3,252,831 | 5/1966 | Ragan | 117—217 |

References Cited by the Applicant

UNITED STATES PATENTS

| | | |
|---|---|---|
| 2,179,566 | 11/1939 | Stoekle. |
| 2,759,078 | 8/1956 | Brown. |
| 3,111,640 | 11/1963 | Dial. |

WILLIAM I. BROOKS, *Primary Examiner.*